United States Patent [19]

Broer et al.

[11] Patent Number: 4,983,479

[45] Date of Patent: Jan. 8, 1991

[54] METHOD OF MANUFACTURING A LAMINATED ELEMENT AND THE ELEMENT THUS OBTAINED

[75] Inventors: Dirk J. Broer; Jan van der Veen, both of Eindhoven; Jan Boven, Waalre, all of Netherlands

[73] Assignee: U.S. Philips Corporation, New York, N.Y.

[21] Appl. No.: 315,066

[22] Filed: Feb. 24, 1989

[30] Foreign Application Priority Data

Feb. 29, 1988 [NL] Netherlands ........................ 8800512
Nov. 17, 1988 [NL] Netherlands ........................ 8802832

[51] Int. Cl.[5] ........................ G02F 1/035; C09K 19/16

[52] U.S. Cl. ........................ 430/20; 430/281; 430/288; 430/394; 350/350 S; 350/347 V; 350/341

[58] Field of Search ................ 430/20, 281, 288, 394; 350/350 S, 347 V, 341; 428/1

[56] References Cited

U.S. PATENT DOCUMENTS 3,794,491 2/1974 Borsenberger ........................ 430/20
3,804,618 4/1974 Forest et al. ........................ 430/20
4,439,514 3/1984 Garito ........................ 430/272
4,615,962 10/1986 Garito ........................ 430/20
4,618,514 10/1986 McClelland et al. ............... 350/341
4,648,925 3/1987 Goepfert ........................ 428/1
4,818,070 4/1989 Gunjima et al. ................ 350/347 V
4,820,026 4/1989 Okada et al. ........................ 350/341
4,879,144 11/1989 Nakura et al. ................... 350/350 S
4,892,392 1/1990 Broer ........................ 350/339 R
4,938,568 7/1990 Margerum et al. ............. 350/347 V

*Primary Examiner*—Marion C. McCamish
*Assistant Examiner*—Christopher D. RoDee
*Attorney, Agent, or Firm*—Norman N. Spain

[57] ABSTRACT

A method of manufacturing a laminated element, in which a substrate 1 is provided with a coating 2 of a liquid-crystalline monomer, in accordance with formula 1, which is oriented by means of an external force, in particular a magnetic field 3, and subsequently subjected to radiation 4, so that a pattern 5 of coating 2 is polymerized and the orientation is fixed, as well as a laminated element, such as an optical component, obtained in accordance with the method.

9 Claims, 3 Drawing Sheets

METHOD OF MANUFACTURING A LAMINATED ELEMENT AND THE ELEMENT THUS OBTAINED

DETAILED DESCRIPTION OF THE INVENTION (a) Technical Field

Figure 1:
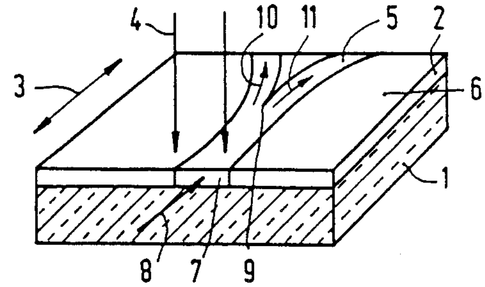

The manufacture of laminated elements having locally different properties such as optical and electrooptical components, in particular, optical filters, waveguides, beam splitters, optical gratings and optical recording elements.

(b) Description of the prior art

In United States Patent Specification No. 4,615,962 it is stated that a method has been discovered by means of which optical and electrooptical components could be manufactured. According to this method, a substrate is first provided with a CAM (coupling agent molecules) layer. This layer is provided with a layer of a dialkenyldiacetylene compound which has liquid-crystalline properties and which is expected to be oriented under the influence of the CAM layer. Subsequently, the oriented layer of the diacetylene compound could be polymerized under the influence of heat or radiation, the orientation of the compound being preserved. It is also stated that it is expected that the polymerization can be carried out in accordance with a pattern. In this manner, a laminated element such as an optical component having locally different properties could be manufactured. In the said United States Patent Specification no description is given of a practical embodiment, as is particularly apparent from the examples 10 and 11. This known method is confined to a theoretical (academic) consideration.

(c) Problems to be solved and object

It is an object of the invention to provide a feasible method of manufacturing a laminated element having locally different properties, in particular an optical component.

A further problem consists in that the orientation of the dialkenyl-diacetylene compounds, which are used in the method described hereinabove under IIb, are difficult to orient and the outcome is not optimal. Moreover, in order to orient the liquid-crystalline diacetylene compounds a special CAM layer is required. A further problem is that on polymerizing the dialkenyl-diacetylene compounds only linear polymers are formed, so that relaxation occurs, in particular at somewhat higher temperatures, and the orientation of the molecules is at least partly lost. It is an object of the invention to provide a method which also enables the use of cross-linked polymers.

(d) Means for solving the problem

The problem is solved in accordance with the invention by means of a method of manufacturing a laminated element having locally different properties, in which a substrate is provided with a coating having at least one patternwise defined section of a polymerized liquid-crystalline monomer, which monomer is first oriented by means of an external force and subsequently polymerized by means of irradiation, such that the direction of orientation is fixed, a monomer which corresponds to the formula wherein P is a polymerizable group, B is a bridging group, and N is a nematic or smectic liquid-crystalline group comprising at least a p-phenylene group and/or a cyclohexyl group, Q is a substituent of the group N or the group BP, wherein B and P have the above-said meaning, being used together with an initiator.

Examples of suitable polymerizable groups (P) are an acrylate or methacrylate group, i.e., a group having the formula $$CH_2{=}\underset{\displaystyle R}{\underset{|}{C}}-\underset{\displaystyle O}{\underset{\|}{C}}-O-,$$

wherein R=H or $CH_3$, an epoxy group which corresponds to the formula

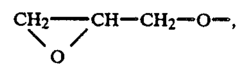

a vinyl ether group which corresponds to the formula $$CH_2{=}CH{-}O{-},$$

and a thiol group—SH, in combination with an ethylene group $CH_2{=}CH{-}$, which combination is referred to as a thiolene system. Examples of nematic or smectic groups (N) are shown in the following formulae:

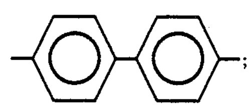

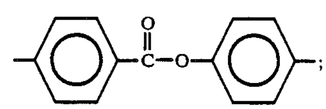

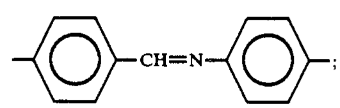

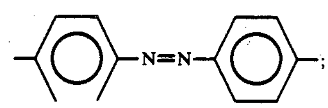

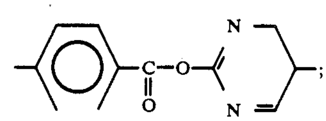

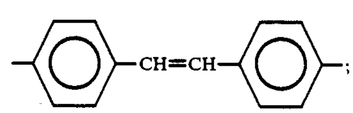

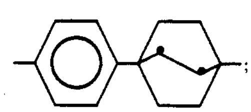

-continued

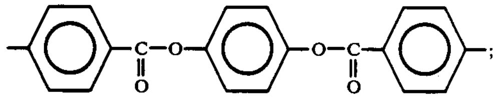

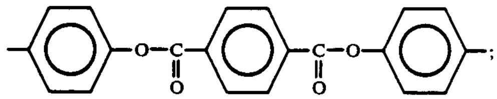

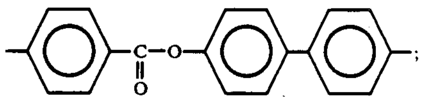

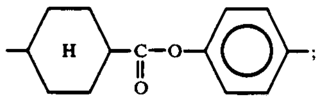

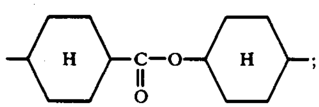

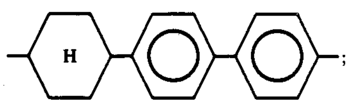

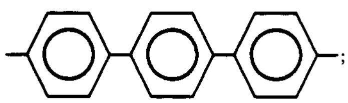

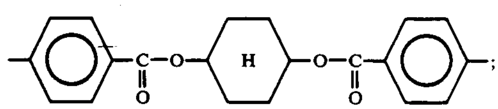

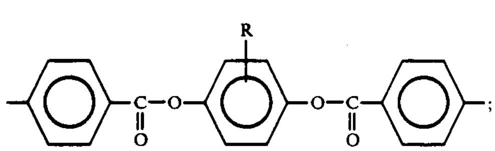

-continued

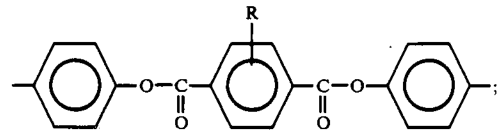

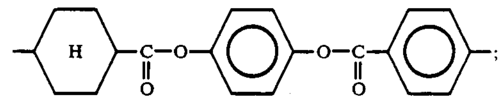

in which R represents an alkyl group with 1–6 carbon atoms.

Examples of bridging groups are represented by the formulae:

$$-(CH_2)_x-;\ -(CH_2)_x-O-;\ [-CH_2-CH_2-O-]_y;$$

$$-(CH_2)_x-O-\underset{\substack{\|\\ O}}{C}-;\ -(CH_2)_x-\underset{\substack{\|\\ O}}{C}-O-;$$

wherein x=1–4; y=1–6.

Examples of substituents of the nematic/smectic group (N) are: cyano group, halogen atom, hydrogen atom, alkyl group having 1–8 carbon atoms, alkoxy group having 1–8 carbon atoms, nitro group, ammino group or an alkyl-substituted amino group in which the alkyl group comprises 1–4 carbon atoms.

Suitable monomers are, in particular, liquid-crystalline diacrylates which are represented by the formula $$CH_2=\overset{R}{\overset{|}{C}}-\overset{O}{\overset{\|}{C}}-O-B-N-B-O-\overset{O}{\overset{\|}{C}}-\overset{R}{\overset{|}{C}}=CH_2 \quad (2)$$

wherein R, B and N have the above-stated meaning.

Examples of effective diacrylates are represented by the following formulae:

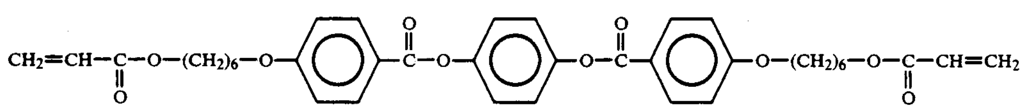
(3)

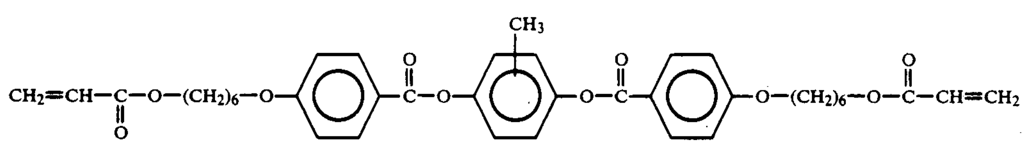
(4)

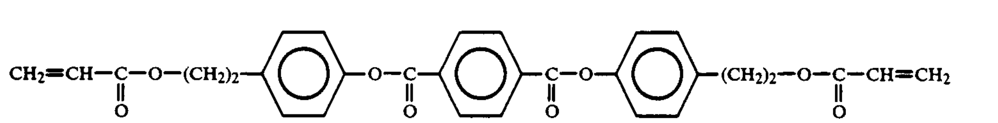
(5)

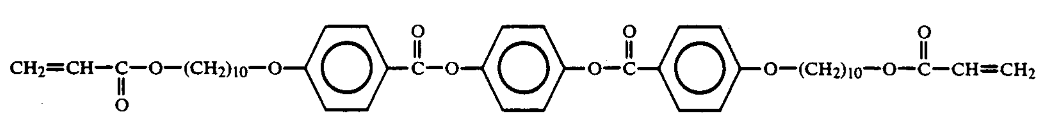
(6)

Examples of suitable initiators are aromatic carbonyl compounds or a ketal such as benzil dimethyl ketal (Irgacure T.M.).

(e) Operation of the invention The relatively small molecules of the liquid-crystalline compound in accordance with formula 1 have a high mobility. Moreover, each molecule comprises a nematic/smectic group N (formula 1). Due to the mobility and the presence of the group N a very rapid, substantially instantaneous orientation of the molecules can be attained by using an external force. Preferably, the external force is a field of force such as an electric or magnetic field, the field direction of which can be readily adjusted, so that any desired orientation of the liquid-crystalline monomer compound can be obtained. It is alternatively possible to rub the substrate surface beforehand in one direction, such that the molecules of the liquid-crystalline monomer compound are subsequently oriented in the direction of rubbing. The orientation is fixed by polymerization of the liquid-crystalline monomer compound. During the polymerization the field applied is maintained, so that disorientation of the molecules is precluded. Preferably, the polymerization is carried out by exposure to light, in particular UV light. To this end, the monomer composition to be polymerized contains a photoinitiator which decomposes into radicals as a consequence of exposure, which radicals initiate the polymerization of the monomers. The photoinitiator is used in a quantity of from 1–5% by weight. Examples of suitable initiators can be represented by the following formulae:

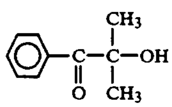
(7) en
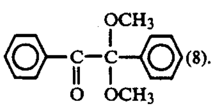
(8).

The oriented compound of formula 1 can be polymerized in a very short time, for example in a period of from a few seconds to maximally a few minutes.

The element manufactured in accordance with the invention has changed properties in the patternwise defined section where the oriented and polymerized compound of formula 1 is present. This change of the properties is primarily determined by the choice of the compound of formula 1 and by the adjusted orientation. Examples of changed properties are: changed electric properties such as a changed electric conductivity, changed mechanical properties such as a different coefficient of expansion or a difference in hardness and resistance to wear. Another interesting example is formed by the changed optical properties such as a changed refractive index, reflection and transmission.

In particular the refractive index and the absorption may differ substantially ;or different directions of polarization of light. Due to this, laminated optical elements such as optical filters, in particular polarization filters, polarization beam splitters, optical gratings, waveguides, optical recording elements and integrated optical systems can be obtained by means of the method in accordance with the invention.

In a suitable embodiment, a liquid-crystalline diacrylate which corresponds to the above-stated formula 2 is used in the method in accordance with the invention.

Examples of effective liquid-crystalline diacrylates are represented in the above-stated formulae 3–6. When the diacrylates (methacrylates) are polymerized a cross-linked structure is formed. This means that the orientation of the polymer molecules is preserved even at higher temperatures. Relaxation does not occur.

In accordance with another suitable embodiment of the method in accordance with the invention, the pattern of the liquid-crystalline polymer is provided by means of a matrix. This embodiment is characterized in that a matrix whose surface has a structure which is the negative of the desired pattern is provided with the liquid-crystalline monomer on which a substrate is provided, after which the monomer is oriented by an external force and polymerized by means of irradiation, so that the direction of orientation is fixed and the substrate and the liquid crystalline polymer layer connected thereto are removed from the matrix, the polymer layer having a defined pattern which is a reproduction (replica) of the pattern of the surface of the matrix.

A polymer layer constituting a mechanically very hard coating is obtained, for example, by imposing a direction of orientation of the monomer, and hence of the polymer, which extends parallel to the surface of the substrate. The external force used for orienting may be an external field of force. It is alternatively possible to rub the substrate surface beforehand in one direction.

The pattern of the liquid-crystalline polymer can also be obtained by irradiating the polymer in accordance with a pattern. In an embodiment which is based on this principle, a uniform layer of the liquid-crystalline monomer is provided on the substrate, the liquid-crystalline monomer is oriented by an external force and the layer is irradiated in accordance with a pattern, the orientation of the liquid-crystalline compound being fixed as a consequence of polymerization.

In accordance with an interesting embodiment of the method in accordance with the invention, integrated optical systems such as an integrated waveguide colour filter can be manufactured readily. This preferred embodiment is characterized in that a uniform layer of the liquid-crystalline monomer is provided on the substrate, the liquid-crystalline monomer is oriented by an external field of force, the layer is irradiated in accordance with a pattern, so that the orientation of the liquid-crystalline monomer is fixed as a consequence of polymerization, subsequently the direction of the field of force is changed and the layer is irradiated again, such that the parts which were not irradiated in the first irradiation step are polymerized, the different orientation of the liquid-crystalline monomer present in these parts being fixed.

In accordance with the preferred embodiment, two mutually different orientations are imposed on the polymer layer provided on the substrate. If desired, t-e above-said second irradiation step can also be carried out in accordance with a pattern and the direction of the field of force can be changed again after which a third irradiation step is carried out, so that a third orientation is obtained. Of course, this process can be repeated at will, so that in the end the substrate is provided with a polymer layer having many areas of mutually different orientations of the polymer molecules. This means that in numerous places of the substrate surface the properties can be imposed at will. It is also possible to remove the unexposed, i.e., still monomer, starting material after an exposure step by means of a solvent and, subsequently, provide a layer of a different liquid-crystalline monomer compound, orient this layer by means of the field and fix the orientation obtained by patterned irradiation which leads to polymerization of the monomer.

In the latter preferred embodiment, preferably, the direction of the field of force is changed such that it is oppositely directed relative to the initial direction.

In another preferred embodiment, the method in accordance with the invention is carried out such that after patterned irradiation, in which operation the oriented, liquid-crystalline monomer is polymerized, the temperature of the layer is increased so that the liquid-crystalline monomer in the unexposed portions of the layer is converted into the isotropic phase, and the layer is irradiated, so that the isotropic phase is fixed due to polymerization of the liquid-crystalline monomer.

The invention further relates to a laminated element obtained by means of the method described above. The element in accordance with the invention comprises a substrate and a coating provided thereon, which coating comprises at least one patternwise defined section of an oriented and radiation-polymerized liquid-crystalline monomer which corresponds to the above-stated formula 1.

In a favourable embodiment of the laminated element the coating comprises a (the) patternwise defined section(s) in which the liquid-crystalline polymer is present in the oriented configuration, and a remaining section in which the polymer is present in the isotropic configuration.

In yet another favourable embodiment of the laminated element the coating comprises a dichroic dye. This element can suitably be used as an optical filter and, in particular, as a polarization filter.

Examples of suitable dichroic dyes are represented by the formulae

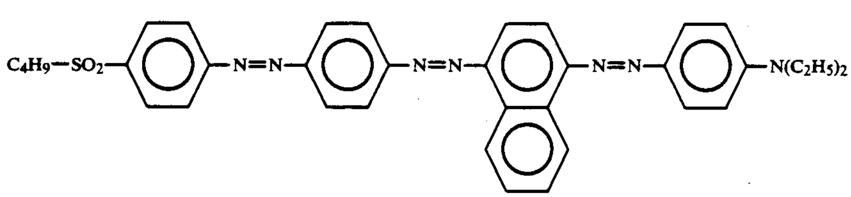

(9)

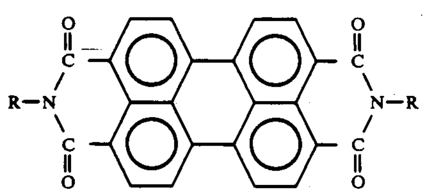

(10)

wherein R represents an aklyl group.

For further dichroic dyes reference is made to Mol. Cryst. Liq. Cryst., 1979, Vol. 55, pp. 1-32.

In yet another favourable embodiment of the laminated element in accordance with the invention, the section which is defined in accordance with a pattern is an information bit which can be read optically.

In the latter embodiment ,he laminated element is an optical recording element in which, in the presence of an electric or magnetic field, information can be recorded by means of modulated laser light and read by means of low-energy continuous laser light. The layer of the liquid-crystalline monomer of formula 1 is oriented by the electric or magnetic field. In the areas irradiated by modulated laser light, said areas having diametral dimensions of, for example, 1-3 micron, polymerization takes place so that the orientation is fixed. These areas (bits) can be read by means of low-energy laser light on the basis of, for example, reflection differences with the surroundings.

EXAMPLES

1. Manufacture of an Y-splitter

In FIG. 1, a layer 2 of a mixture of liquid-crystalline monomer compounds is provided on a glass or polymethyl methacrylate substrate which is indicated by reference numeral 1. The mixture comprises 20% by weight of a compound of formula 3, 79% by weight of a compound of formula 4, and 1% by weight of benzil dimethyl ketal (initiator, Irgacure T.M). In the present example, the layer thickness mounts to 10 μm. Before the layer 2 is provided the surface of substrate 1 is rubbed in the direction indicated by an arrow 3.

The transition temperature from the crystalline to the nematic (liquid-crystalline) phase of the mixture used is 81° C. The element, i.e. substrate 1 together with layer 2, is heated to 90° C. In the menatic phase obtained, the molecules of the liquid-crystalline monomer compounds will be oriented in the direction of rubbing indicated by arrow 3. The direction of orientation is equal to the direction of rubbing of the substrate. Besides the application of a frictional force (to the substrate) the molecules of the liquid-crystalline monomer compounds in the nematic phase can also be oriented by means of an external field of force, in particular a magnetic field or an electric field. To this end, a magnetic field having a strength of, for example, 10 k.Gauss is applied in the direction indicated by arrow 3. The obtained direction of orientation of the molecules of the LC (liquid-crystalline) compounds corresponds to the field direction of the magnetic field.

Subsequently, the element 1, 2 is patternwise exposed UV light having an emission wavelength of 360 nm, in the direction indicated by arrows 4. The light source has a power of 5 mW/cm$^2$. The exposure time amounts to 300 s. The unexposed portion of layer 2 has the shape of a Y and is indicated by reference numeral 5. During exposure polymerization takes place of the liquid-crystalline monomer compounds. Thus, the orientation of the LC molecules is fixed in the portion indicated by reference numeral 6.

Subsequently, the temperature in the element (1-5) is increased to above 125° C., for example 135° C. The transition temperature of the mixture for the transition from the nematic to the isotropic phase is approximately 125° C. By heating to 135° C., the unexposed portion 5 of layer 2 is converted into the isotropic phase. Subsequently, the entire surface of layer 2 is exposed to UV light at this temperature. Due to this, the molecules of the monomer compounds in the portion 5 of layer 2 are polymerized, the isotropic phase present in the said portion being fixed. The Y-shaped portion 5 of layer 2 has a refractive index of 1.57. The refractive index of the surrounding area 6 is 1.53 in the direction of propagation of light. Thus, the Y-shaped portion 5 forms a light conductor, a light beam 8 incident on surface 7 remaining within the Y-shape and being divided into two sub-beams 10, 11 at the bifurcation 9 of the Y-shape. If desired, a coating having a low refractive index may be applied to the Y-splitter obtained, or the layer 2 of liquid-crystalline compounds may be provided between two glass plates or synthetic resin plates.

2. Manufacture of an integrated polarizer and waveguide

Figure 2:
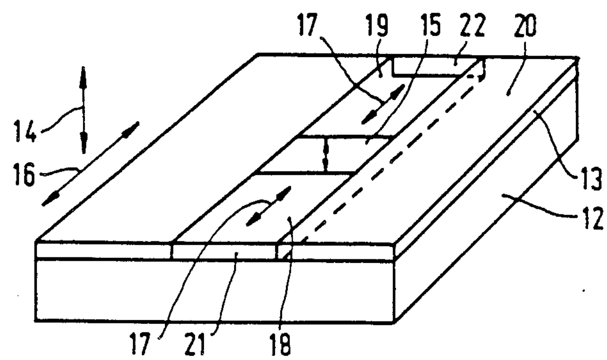

In FIG. 2, reference numeral 12 denotes a substrate of silicon having a thickness of, for example, 0.5 mm. By means of spin-coating this substrate is provided with a layer 13 of a mixture comprising 96% by weight of a liquid-crystalline monomer compound, represented by formula 3, 2.5% by weight of a dichroic azo dye, represented by formula 9, and 1.5% by weight of an initiator, represented by formula 7. Layer 13 has a thickness of 50 μm. Layer 13 is heated to a temperature exceeding the transition temperature (105° C.) from the crystalline phase to the nematic phase. A suitable temperature is 110° C. The molecules of the liquid-crystalline monomer compound are oriented in a direction parallel to the magnetic field direction under the influence of a magnetic field of 10 k.Gauss having a yield direction which is indicated by the arrow 14. The dichroic dye molecules are oriented correspondingly. Thus, the molecules extend perpendicularly to the surface of the Si substrate 12. An area 15 of layer 13 is subsequently exposed to UV light of 360 nm for a few minutes while the temperature and the magnetic field are preserved. The power of the low-pressure mercury vapour lamp used for this purpose is 5 mW/cm². Due to exposure the oriented monomer molecules in the area 15 of layer 13 are polymerized so that the orientation is fixed. Subsequently, the direction of the magnetic field is changed such that the field direction, indicated by arrow 16, is parallel to the surface of layer 13. Consequently, the orientation of the molecules of the liquid-crystalline monomer compound outside the area 15 changes such that the molecules are oriented parallel to the surface of layer 13, in the direction indicated by arrow 17. This direction of orientation corresponds to the direction of the magnetic field applied. The areas 18 and 19 of layer 13 which are situated on either side of the area 15 are exposed to UV light in the same manner as area 15. Due to exposure, the molecules of the monomer compound present in the areas 18 and 19 are polymerized. In this process, the direction of orientation is fixed. The unexposed portion of layer 13 is removed by means of immersion in tetrahydrofuran. A layer 20 of polymethyl methacrylate is provided instead. This layer is provided by means of a spin-coating operation in which a 20% solution of polymethyl methacrylate in ethyl acetate is used The refractive index of the oriented areas 15, 18 and 19 is 1.68 in a direction parallel to the direction of orientation, and 1.53 in the direction perpendicular to the direction of orientation. The refractive index of the area 20 is 1.49. This means that the areas 15, 18 and 19 together form a waveguide. Light which is incident via surface 21 is conducted through layer 13 of the element via the areas 18, 15, 19. On passing through layer 15, the vertical polarization component of the incident light is absorbed by the oriented dye molecules. Horizontally polarized light is transmitted and leaves the element at the surface 22 of area 19, which is located opposite surface 21.

3. Manufacture of a planar optical colour filter

Figure 3:
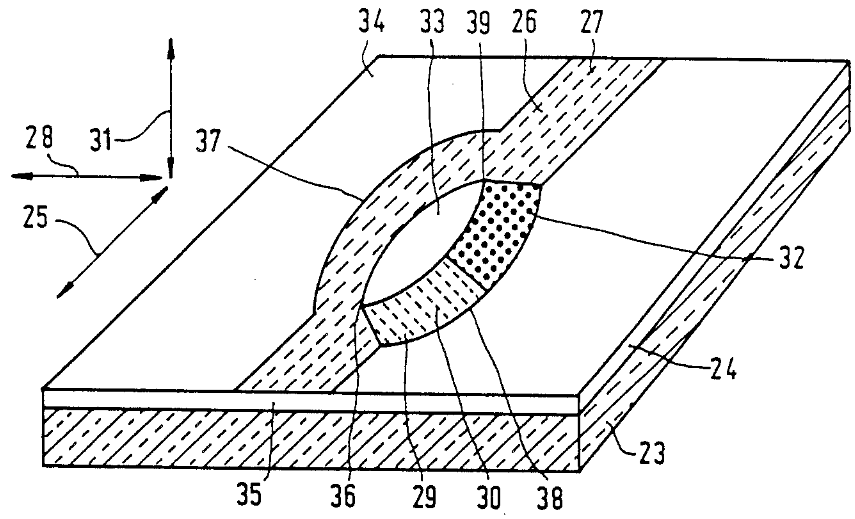

In FIG. 3, reference numeral 23 denotes a substrate of glass which is provided with a layer 2§of a liquid-crystalline mixture comprising 98.5% by weight of a monomer compound, represented by formula 5, and 1.5% by weight of the initiator represented by formula 7. The layer thickness amounts to 100 μm. By means of a magnetic field, layer 24 is oriented in the direction indicated by the arrow 25 in the same manner as described with respect to the preceding Figures. The said orientation is carried out at a temperature exceeding the transition temperature from the crystalline to the nematic phase, at 110° C. Layer 24 is exposed to UV light according to a pattern so that polymerization of the monomer molecules in the exposed area 26 takes place. In this process, the direction of orientation of these molecules is fixed. The orientation is represented by means of hatching 27. Subsequently, the field direction of the magnetic field is changed into a direction 28 which is perpendicualr to the initial field direction, yet parallel to the surface of layer 24. The area 29 is then exposed to UV light ($\lambda=360$ nm) and the molecules in this area are polymerized. The direction of orientation fixed in this process is represented by hatching 30. The field direction of the magnetic field is changed again and extends perpendicularly to the surface of layer 24. This direction is indicated by arrow 31. Area 32 of layer 24 is exposed to UV light. The polymer molecules obtained have an orientation which is perpendicular to the surface of layer 24. This orientation is represented by dots. Subsequently, the magnetic field is changed again in a direction indicated by arrow 25. The temperature of layer 24 is reduced from 140° C. to 100° C. Due to this, the degree of orientation and the double refraction are increased. As a consequence hereof, the component of the refractive index which extends perpendicularly to the molecular axis decreases. The entire surface of layer 21 is then exposed to UV light. As a consequence hereof, the higher degree of orientation in the areas 33 and 34 is fixed. These areas have a refractive index of 1.53. The anisotropic area 26 has a refractive index of 1.54. The anisotropic areas 29 and 31 have two refractive indices ($n_o$ and $n_e$) of 1.53 and 1.69, respectively, for the direction of propagation of light. Light which is incident via surface 35 will follow the light conductor 26, 29, 31 and take a left-hand path 37 or a right-hand path 38 at the location of the bifurcation 36. In the right-hand path the vertical polarization component of the light will be retarded in the area 29 due to the higher refractive index. In the subsequent area 31 the horizontal polarization component of the light will be retarded. After passing through the areas 29 and 31 all the light is retarded, its phase lagging that of the light which has taken the left-hand path. Beyond the junction 39 the left-hand beam and the right-hand beam come together again. On account of the phase difference, light of specific wavelength will be suppressed by destructive interference. Owing to this, the element shown operates as a colour filter. The wavelengths at which suppression takes place are determined by the optical difference in path length according to the formula $$R = \frac{d}{\lambda} \cdot \Delta n$$

wherein

R is the optical retardation, d is the thickness of the material,

λ is the wavelength of the light used,

Δn is the difference in refractive index.

The colour can be adjusted by varying the length ratio of the areas 30 and 31.

4. Manufacture of an optical recording element

Figure 4:
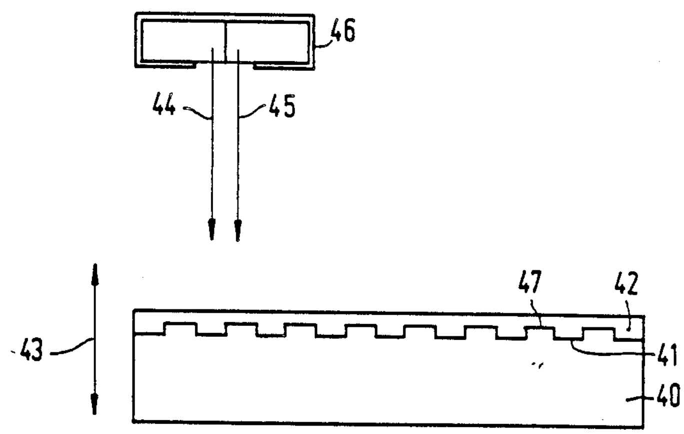

In FIG. 4, reference numeral 40 denotes a substrate plate of polycarbonate which is provided on one side with a spiral-shaped groove 41 which forms a follower track for optically scanning the plate. A reflection layer of A1, not shown, is provided on the surface in which a follower track is formed. On top of this reflection layer there is a thin layer 42 of a liquid-crystalline monomer compound, as represented by formula 3. The layer 12 also contains 1.5% by weight of a benzil dimethyl ketal as an initiator. The layer 42 of the monomer compound is oriented in a magnetic field, the field direction of which is indicated by arrow 43 The monomer molecules are oriented in a direction perpendicular to the surface of the plate This orientation takes place at a temperature which is higher than the transition temperature crystalline-nematic. A suitable temperature is 110° C. The monomer layer is scanned with a low-energy laser light beam indicated by reference numeral 44. This beam does not bring about changes in the monomer layer 42 because no absorption of light takes place. The laser light is used only to follow the follower track on the basis of phase differences in the reflected light emanating from the track and from the environment of the track. A second laser light beam 45 is coupled, via for example a common housing 46, to the first laser light beam, the light spot emanating from the second beam being moved relative to that of the first beam in a radial direction relative to the plate, for example over a distance equal to half the combined width of the groove 41 and the land part 47 situated between the groove turns. The second laser light beam is pulsated in conformity with the information to be recorded. Polymerization of the monomer compound takes place in the irradiated areas of layer 42. In this process, the direction of orientation of the compound is fixed. Consequently, information bits of oriented and polymerized material are formed. After recording the information the magnetic field is switched off. After a short time, unoriented domains of the liquid-crystalline compound will be formed in the portion of layer 12 located outside the information bits. This area will exhibit dynamic scattering. The information bits can be read optically on the basis of reflection differences with the surrounding area of LC domains exhibiting dynamic scattering. Alternatively, the temperature of the entire layer 42 can be raised to, for example, 160° C. after information has been recorded, such that the area outside the information bits exhibits an isotropic phase. By irradiating the entire surface of layer 42, the isotropic phase can be fixed due to polymerization of the isotropic monomer compound. The oriented information bits can be read optically on the basis of reflection differences with the isotropic invenronment.

5. Manufacture of a polarization beam splitter

Figure 5:
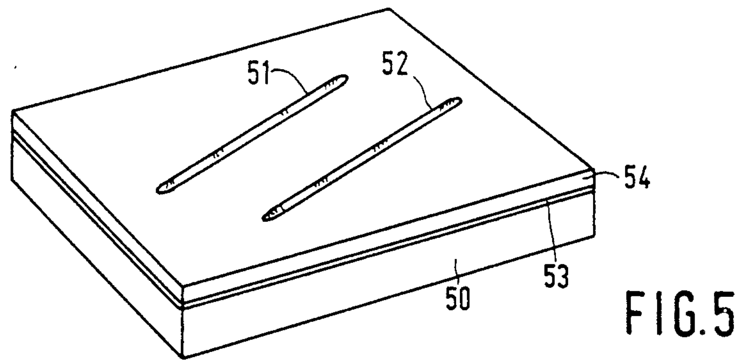

In FIG. 5, reference numeral 50 denotes an aluminium matrix having a rectangular cross-section of 80×60 mm and a height of 10 mm. Two parallel grooves 51 and 52 having a depth of 1 mm are provided in the upper surface of matrix 50. The upper surface of the matrix 50 is covered with a very thin polyimide layer 53. The matrix is heated in a vacuum to a temperature of 350° C. for 1 hour. Subsequently, the polyimide layer is rubbed in a direction parallel to the grooves by means of a nylon brush.

The matrix is heated to a temperature of 13O° C. A thin layer which is not shown of a liquid-crystalline monomer A, corresponding to the above-stated formula 6, and comprising 1% by weight of a photoinitiator in accordance with formula 8, is applied to the heated matrix. A glass plate 51 having a thickness of 12 mm is provided on the monomer layer A. On the side of the matrix, the glass plate is provided with a UV-light cured layer, which is not shown, of a liquid-crystalline monomer. A glass plate which is provided with such a layer is obtained by providing the surface with a 2% solution in tetrahydrofuran of a UV light curable composition I comprising 60 parts by weight of a liquid-crystalline monomer compound of formula 11, 36 parts by weight of a monomer in accordance with formula 12, and 4 parts by weight of a photo-initiator in accordance with formula 8.

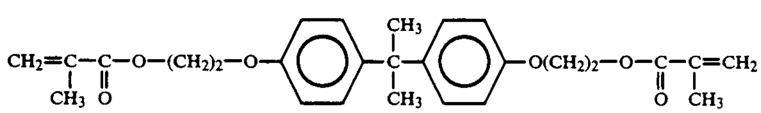

(11)

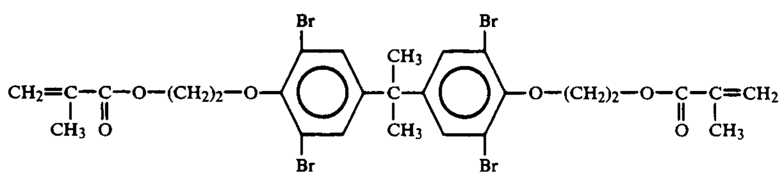

(12)

The solution is provided by means of spin coating. After evaporation of the solvent, the layer is exposed to UV light, so that polymerization (curing) takes place. The polymer layer B obtained is rubbed with a velvet cloth in a direction parallel to the grooves 51 and 52.

After the glass plate, which has been provided with an oriented polymer layer 8 in the above-described manner, is provided on the layer of monomer A, this monomer is exposed to UV light via the glass plate at a temperature of 130° C. It is to be noted that the monomer A is oriented by contacting the oriented polyimide layer 53. This degree of orientation of the molecules of monomer A is increased due to the contact with the oriented polymer layer B of the glass plate. As a consequence of exposure to UV light the monomer A polymerizes into an oriented polymer. After the matrix is removed a product in accordance with FIG. 6 is obtained.

Figure 6:
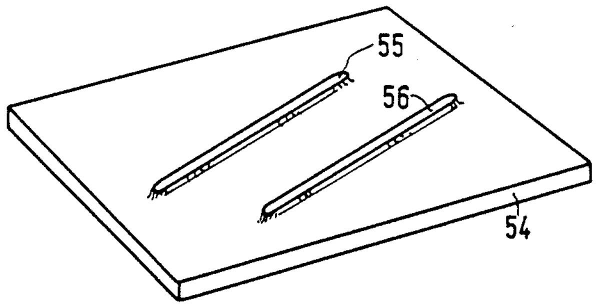

In FIG. 6, reference numeral 54 denotes the glass plate which is provided with lands 55 and 56 of oriented polymer on one side. The refractive indices are $n_o=1.19$ and $n_e=1.58$. A second glass plate 57 is provided on the lands and the space between the glass plates is filled with the above-described curable, isotropic, composition I, by capillary suction. The composition I is polymerized by exposure to UV light, so that an isotropic polymer layer 58 having a refractive index $n_i=1.58$ is obtained. The polarization beam splitter obtained is shown in FIG. 7.

Figure 7:
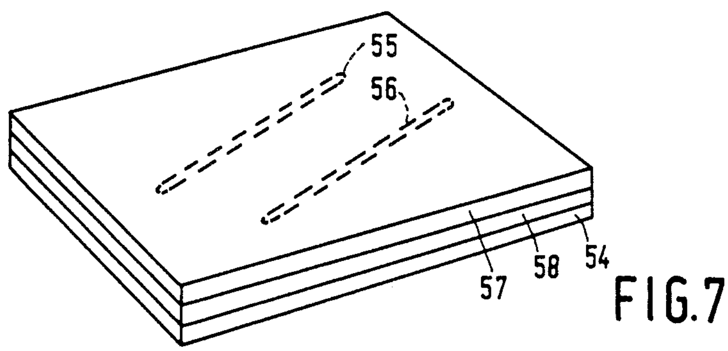
Figure 8:
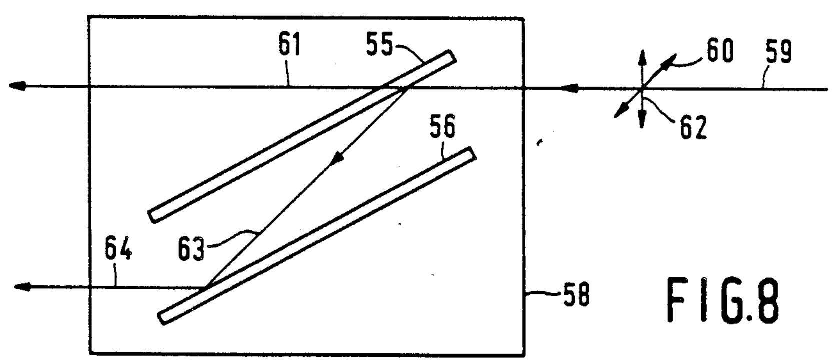

The operation of the polarization beam splitter of FIG. 7 is explained by means of FIG. 8. FIG. 8 is a top view of a section of the beam splitter across layer 58, which is an isotropic polymer layer having a refractive index $n_i=1.58$, as stated above. As has been described above, the rods 55, 56 are manufactured from an oriented liquid-crystalline polymer having an anisotropic refractive index which can be split up into two components, namely the refractive index $n_e$ for the plane parallel with the direction of orientation of the rods, and $n_o$ for the plane perpendicular to the direction of orientation. The refractive index $n_o$ has a value of 1.49 and $n_e$ has a value of 1.58.

The incident unpolarized light beam 59 passes through the isotropic polymer layer 58 until it reaches the rod 55 of oriented polymer. At this location a bifurcation of the light beam 59 takes place, the direction depending on the two directions of polarization of light beam 59. The light having a direction of polarization 60 which is parallel to the direction of orientation of the polymer of rod 55 is passed as polarized light beam 61 because $n_e=n_i$. The light having a direction of polarization 62 which is perpendicular to the orientation of rod 55 is reflected according to Fresnel's law, the polarized light beam 63 being formed. At this stage, the essential function of a polarization beam splitter is attained. However, for many applications it is desirable that both polarized light beams 61 and 63 are parallel. To realize this a second rod 56 of oriented polymer is provided such that beam 64 extends parallel to beam 61.

SHORT EXPLANATION OF THE DRAWING

The drawing comprises eight Figures, wherein

FIG. 1 is a view of an integrated waveguide Y-splitter manufactured according to the method of the invention, FIG. 2 is a view of an integrated waveguide polarizer manufactured according to the invention, FIG. 3 is a view of an integrated waveguide colour filter manufactured by means of the method according to the invention, FIG. 4 is a cross-sectional view of an optical recording element manufactured according to the invention, FIGS. 5, 6 are views of elements used in the method according to the inventIon, for the manufacture of a beam splitter according to FIG. 7, FIG. 7 is a view of a polarization beam splitter obtained according to the invention, and FIG. 8 is a top view of a horizontal section of the beam splitter of FIG. 7.

We claim:

1. A method of manufacturing a laminated element having locally different optical properties comprising (a) providing a substrate with a coating of a polymerizable liquid-crystalline monomer and an initiator, said monomer having the formula PBNQ where
 P is a polymerizable group,
 B is a bridging group,
 N is a nematic or smectic liquid crystalline group comprising a p-phenylene and/or cyclohexyl group,
 Q is the group BP wherein B and P have the above-stated meanings or a substituent selected from the group consisting of hydrogen, halogen, cyano, alkyl of 1–8 carbon atoms, alkoxy of 1–8 carbons, -nitro, amino and a 1–4 carbon alkyl substituted amino, (b) orienting said monomer by means of an external force, (c) irradiating said oriented monomer according to a desired pattern to polymerize the monomer and fix the direction of orientation of the polymerized monomer according to the desired pattern, (d) changing the direction of the field of force, and (e) irradiating parts of the monomer previously not irradiating to thereby polymerize said parts and fix the different direction of orientation in these parts.

2. A method as claimed in claim 1, characterized in that the monomer corresponds to the formula $$CH_2{=}C(R){-}C({=}O){-}O{-}B{-}N{-}B{-}O{-}C({=}O){-}C(R){=}CH_2 \quad (2)$$

wherein B and N have the meaning stated in claim 1 and R is a hydrogen atom or a methyl group.

3. A method as claimed in claim 2, characterized in that a monomer is used which is selected from one or more compounds of the formulae:

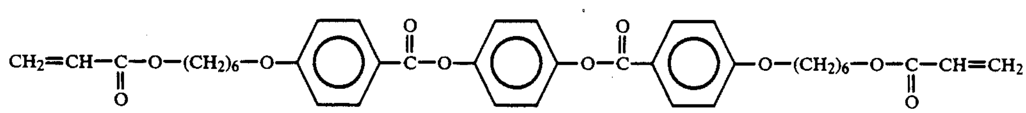
(3)

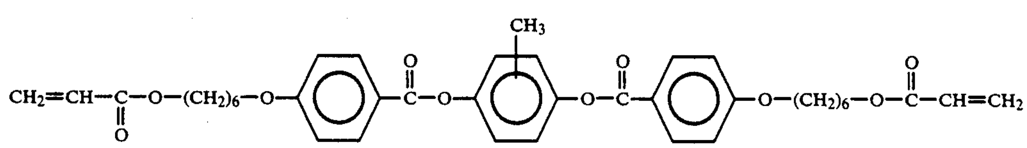
(4)

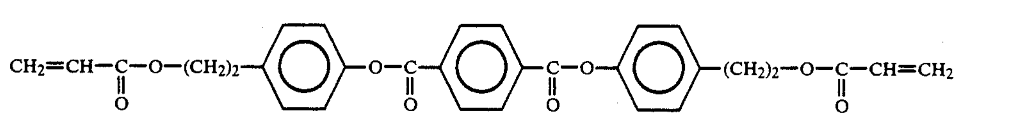
(5)

-continued

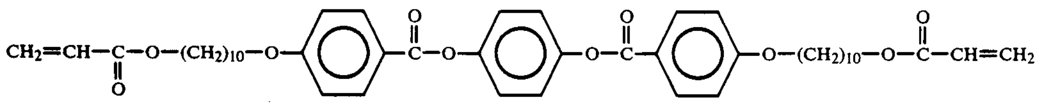

(6)

4. A method as claimed in claim 1, characterized in that the direction of the field of force is changed such that it is oppositely directed relative to the initial direction.

5. A method as claimed in claim 1 characterized in that after irradiation the temperature of the layer of the liquid-crystalline monomer is increased such that the liquid-crystalline monomer is the unexposed portions of the layer is converted into the isotropic phase, and the layer is irradiated, so that the isotropic phase is fixed due to polymerization of the liquid-crystalline monomer.

6. A laminated element having locally different properties, which is manufactured by means of the method as claimed in claim 1, characterized in that the element comprises a substrate and a coating having at least one patternwise defined section, which is composed of an oriented and radiation-polymerized liquid-crystalline monomer which corresponds to formula 1.

7. A laminated element as claimed in claim 6, characterized in that the coating comprises the patternwise defined section(s) in which the liquid-crystalline polymer is present in the oriented configuration, and a remaining section which is present in an isotropic configuration.

8. A laminated element as claimed in claim 6 characterized in that the coating comprises a dichroic dye.

9. A laminated element as claimed in claim 6 characterized in that the patternwise defined section forms an information bit which can be read optically.

* * * * *